United States Patent
Meiser et al.

(10) Patent No.: US 11,121,220 B2
(45) Date of Patent: Sep. 14, 2021

(54) SEMICONDUCTOR DEVICE INCLUDING TRENCH STRUCTURES AND MANUFACTURING METHOD

(71) Applicant: Infineon Technologies AG, Neubiberg (DE)

(72) Inventors: Andreas Meiser, Sauerlach (DE); Caspar Leendertz, Munich (DE); Anton Mauder, Kolbermoor (DE); Roland Rupp, Lauf (DE)

(73) Assignee: Infineon Technologies AG, Neubiberg (DE)

(*) Notice: Subject to any disclaimer, the term of this patent is extended or adjusted under 35 U.S.C. 154(b) by 3 days.

(21) Appl. No.: 16/700,475

(22) Filed: Dec. 2, 2019

(65) Prior Publication Data

US 2020/0176568 A1    Jun. 4, 2020

(30) Foreign Application Priority Data

Dec. 3, 2018   (DE) .......................... 102018130737.3

(51) Int. Cl.
*H01L 29/10*   (2006.01)
*H01L 29/66*   (2006.01)
(Continued)

(52) U.S. Cl.
CPC ...... *H01L 29/1087* (2013.01); *H01L 29/0634* (2013.01); *H01L 29/41741* (2013.01);
(Continued)

(58) Field of Classification Search
None
See application file for complete search history.

(56) References Cited

U.S. PATENT DOCUMENTS

2019/0348510 A1* 11/2019 Yilmaz ............... H01L 29/0696

FOREIGN PATENT DOCUMENTS

DE    102018104581 A1    9/2018

OTHER PUBLICATIONS

A. Agarwal, K. Han and B. J. Baliga, "Analysis of 1.2 kV 4H—SiC Trench-Gate MOSFETs with Thick Trench Bottom Oxide," 2018 IEEE 6th Workshop on Wide Bandgap Power Devices and Applications (WiPDA), Atlanta, GA, 2018, pp. 125-129, doi: 10.1109/WiPDA.2018.8569070 (Year: 2018).*

(Continued)

*Primary Examiner* — J. E. Schoenholtz
(74) *Attorney, Agent, or Firm* — Murphy, Bilak & Homiller, PLLC

(57) ABSTRACT

A semiconductor device includes a silicon carbide semiconductor body including a source region of a first conductivity type, a body region of a second conductivity type, shielding regions of the second conductivity type and compensation regions of the second conductivity type. Trench structures extend from a first surface into the silicon carbide semiconductor body along a vertical direction. Each of the trench structures includes an auxiliary electrode at a bottom of the trench structure and a gate electrode between the auxiliary electrode and the first surface. The auxiliary electrode is electrically insulated from the gate electrode. The auxiliary electrode of each of the trench structures is adjoined by at least one of the shielding regions at the bottom of the trench structure. Each of the shielding regions is adjoined by at least one of the compensation regions at the bottom of the shielding region.

17 Claims, 5 Drawing Sheets

(51) Int. Cl.
*H01L 29/06* (2006.01)
*H01L 29/78* (2006.01)
*H01L 29/423* (2006.01)
*H01L 29/417* (2006.01)
*H01L 29/16* (2006.01)

(52) U.S. Cl.
CPC .... *H01L 29/4236* (2013.01); *H01L 29/66068* (2013.01); *H01L 29/7813* (2013.01); *H01L 29/1608* (2013.01)

(56) References Cited

OTHER PUBLICATIONS

U.S. Appl. No. 62/668,800, filed 2018.*

* cited by examiner

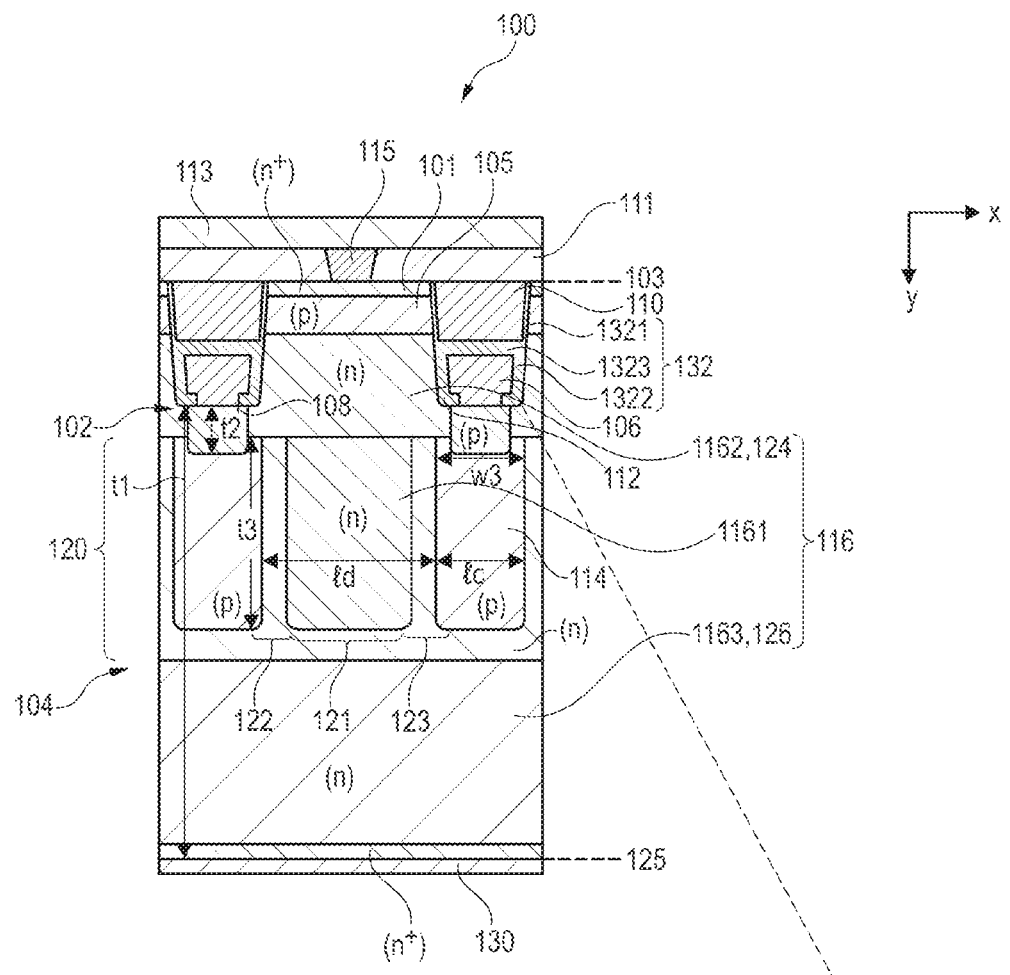
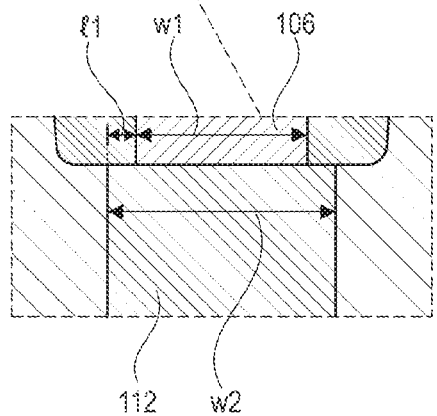
Fig. 6

SEMICONDUCTOR DEVICE INCLUDING TRENCH STRUCTURES AND MANUFACTURING METHOD

TECHNICAL FIELD

The present disclosure is related to semiconductor devices, in particular to silicon carbide (SiC) semiconductor devices and manufacturing methods therefor.

BACKGROUND

Technology development of SiC semiconductor devices including field effect transistor cells aims at reducing an area-specific on-state resistance $R_{DS(on)}$ without adversely affecting a blocking voltage capability $V_{DS}$ between source and drain. Although one device characteristic may be improved by varying a certain device parameter, this may lead to deterioration of another device characteristic. As an example, the area-specific on-state resistance $R_{DS(on)}$ may be improved by, for instance, increasing a drift zone doping concentration, which may, however, lead to deterioration of the blocking voltage capability $V_{DS}$ between source and drain. Thus, device parameters are designed during technology development based on a number of tradeoffs to be met in view of target device specifications.

There is a need to improve semiconductor devices based on silicon carbide.

SUMMARY

An embodiment of the present disclosure relates to a semiconductor device that includes a silicon carbide semiconductor body comprising a source region of a first conductivity type, a body region of a second conductivity type, shielding regions of the second conductivity type and compensation regions of the second conductivity type. The semiconductor device further includes trench structures extending from a first surface into the silicon carbide semiconductor body along a vertical direction. Each of the trench structures comprises an auxiliary electrode at a bottom of the trench structure and a gate electrode between the auxiliary electrode and the first surface. The auxiliary electrode is electrically insulated from the gate electrode. The auxiliary electrode of each of the trench structures is adjoined by at least one of the shielding regions at the bottom of the trench structure. Each of the shielding regions is adjoined by at least one of the compensation regions at the bottom of the shielding region.

Another embodiment of the present disclosure relates to a method of manufacturing a semiconductor device. The method comprises forming, in a silicon carbide semiconductor body, a source region of a first conductivity type, a body region of a second conductivity type, shielding regions of the second conductivity type and compensation regions of the second conductivity type. The method further comprises forming trench structures extending from a first surface into the silicon carbide semiconductor body along a vertical direction. Each of the trench structures comprises an auxiliary electrode at a bottom of the trench structure and a gate electrode between the auxiliary electrode and the first surface. The auxiliary electrode is electrically insulated from the gate electrode. The auxiliary electrode of each of the trench structures is adjoined by at least one of the shielding regions at the bottom of the trench structure. Each of the shielding regions is adjoined by at least one of the compensation regions at a bottom of the shielding region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments of the semiconductor device and the method of manufacturing a semiconductor device, and together with the description serve to explain principles of the embodiments. Further embodiments and intended advantages will be readily appreciated as they become better understood by reference to the following detailed description. Further embodiments are described in the following detailed description and the claims.

FIG. 6 illustrates a cross-sectional view through another embodiment of a super-junction silicon carbide semiconductor device including a combination of features illustrated in the embodiments of FIGS. 4 and 5.

DETAILED DESCRIPTION

Figure 1:
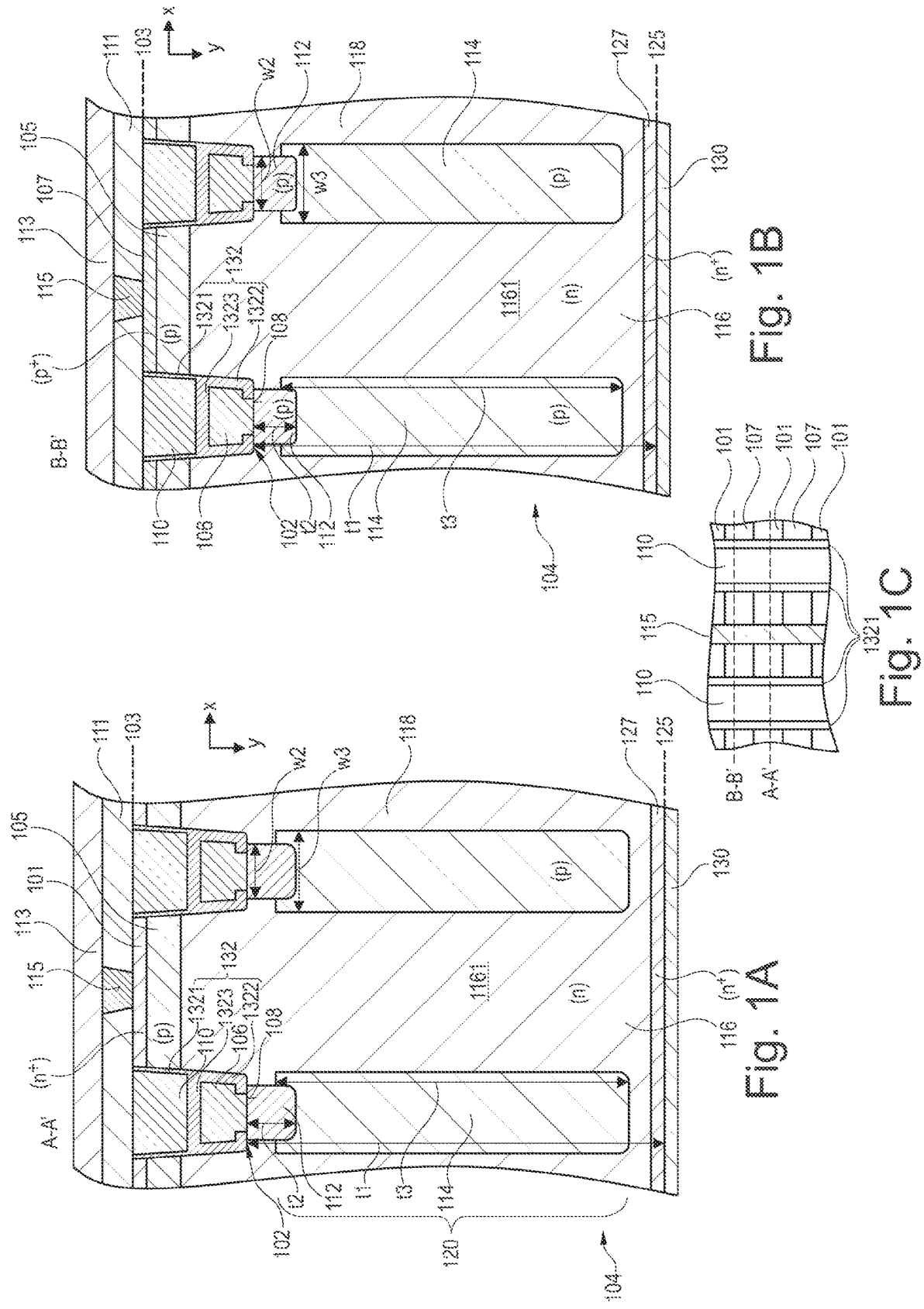
FIGS. 1A, 1B illustrate cross-sectional views through an embodiment of a super-junction silicon carbide semiconductor device along intersection lines AA' and BB' of the top view of FIG. 1C.
FIG. 1C is a top view of the semiconductor device illustrated in FIGS. 1A, 1B.

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise. If two components "adjoin" each other, they may either be in direct contact with each other (i.e., directly adjoin each other) at least in places or may be separated from each other by only a small distance. The small distance may be at most 100 nm, typically at most 20 nm or at most 10 nm.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two directly adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

According to an embodiment a semiconductor device may include a silicon carbide semiconductor body. The silicon carbide semiconductor body may include a source region of a first conductivity type, a body region of a second conductivity type, shielding regions of the second conductivity type and compensation regions of the second conductivity type. The semiconductor device may further include trench structures. The trench structures may extend from a first surface into the silicon carbide semiconductor body along a vertical direction. Each of the trench structures may comprise an auxiliary electrode at a bottom of the trench structure and a gate electrode between the auxiliary electrode and the first surface. The auxiliary electrode may be electrically insulated from the gate electrode. The auxiliary electrode of each of the trench structures may be adjoined by at least one of the shielding regions at the bottom of the trench structure. Each of the shielding regions may be adjoined by at least one of the compensation regions at the bottom of the shielding region. The first conductivity type may be n-type and the second conductivity type may be p-type. Alternatively, the first conductivity type may be p-type and the second conductivity type may be n-type.

The silicon carbide (SiC) semiconductor body may be from a hexagonal phase of silicon carbide, e.g., 4H-SiC. The silicon carbide semiconductor body may have an off-direction, for example in a <11-20> or a <1-100> direction. An off-axis angle of the silicon carbide semiconductor body may be in a range from 2° to 8°, typically 4°. The first surface of the silicon carbide semiconductor body may be a main extension plane of the silicon carbide semiconductor body and is spanned by lateral directions. The vertical direction may run perpendicular to the first surface and/or the lateral directions.

The shielding regions and the compensation regions may differ from one another with respect to at least one of: a doping concentration profile along the vertical direction, a doping concentration profile along the lateral direction, a dimension along the vertical direction, a dimension along the lateral direction, a doping concentration averaged along the vertical direction, a doping concentration averaged along the lateral direction, dopant species, for example. Here and in the following, a "dimension" of a component (e.g., a region, a structure, a portion and/or an electrode) of the semiconductor device in a direction may be the maximum extension of said component in said direction. For example, a "lateral dimension" of a component may be a width of said component. A "vertical dimension" of a component may be a height and/or a thickness of said component.

In one or more embodiments, the shielding regions and/or the compensation regions may be formed by one or a plurality of ion implantation profiles overlapping along the vertical direction. Each of the shielding regions and the compensation regions may include one or more dopant species of the second conductivity type, e.g. one or more of dopant elements such as phosphorus (P) and nitrogen (N) and other suitable elements or complexes for n-type doping or one or more of dopant elements such as boron (B), gallium (Ga) and aluminum (Al) and other suitable elements or complexes for p-type doping. The term "dopant species" denotes a specific dopant element, e.g. P for n-type doping or B for p-type doping in silicon carbide. For example, the dopants may be introduced into the silicon carbide semiconductor body by means of ion implantation and/or during epitaxial growth. The number of dopant species may vary along a vertical profile of dopants of the shielding regions and/or a vertical profile of dopants of the compensation regions. The number of dopant species may correspond to the number of different dopant elements, and/or the composition of dopants species, i.e. the respective ratio of different dopant elements. The effective doping concentration at a specific depth of the profile of dopants of the shielding regions and/or compensation regions corresponds to a sum of the doping concentrations of the different dopant species at the specific depth in case of two or more dopant species of the first conductivity type being present at the specific depth (so-called effective doping concentration).

According to an embodiment, a number and/or type and/or composition of dopant species may vary with respect to the shielding regions and the compensation regions, for example.

Each of the trench structures may further include an insulating structure. The insulating structure may include or consist of one layer or a combination of layers, e.g. a layer stack of dielectric layers. For example the insulating structure may include oxide layers such as thermal oxide layers or deposited oxide layers, e.g. undoped silicate glass (USG), phosphosilicate glass (PSG), boron silicate glass (BSP), borophosphosilicate glass (BPSG), nitride layers, high-k dielectric layers or low-k dielectric layers. One part of the insulating structure arranged between the gate electrode and the auxiliary electrode may be a separation dielectric for electrically insulating the gate electrode from the auxiliary electrode. Another part of the insulating structure may be a gate dielectric arranged between the gate electrode and the body region, for example. Yet another part of the insulating structure, e.g. a dielectric, may be arranged between the auxiliary electrode and the silicon carbide semiconductor body. The auxiliary electrode and the gate electrode may be electrically connected to different electric potentials, for example.

A vertical extension of the trench structures may be in a range from 0.5 µm to 5 µm, e.g., in a range from 1 µm to 3 µm. Sidewalls of the trench structures may be perpendicular to the first surface or may taper with increasing distance to the first surface. A lateral width of the trench structures may be in a range from 500 nm to 5 µm, e.g., in a range from 1 µm to 3 µm, for example.

The gate electrode and/or the auxiliary electrode may include or consist of one electrode material or a combination of electrode materials, for example a doped semiconductor material (e.g., a degenerate doped semiconductor material) such as doped polycrystalline silicon, metal or metal compounds.

The shielding regions may protect the gate dielectric from high electric field strengths occurring during a reverse voltage mode of the semiconductor device, for example. The shielding regions may also adjoin a sidewall of the trench structures. The shielding regions and/or the body region may adjoin the trench structures from opposite sidewalls, for example. The body region may also adjoin the trench structures from opposite sidewalls of the trench structures and the shielding regions may adjoin the trench structures at a bottom of the trench structures, for example.

In the embodiments of the semiconductor device, a tradeoff between device parameters may be improved by the compensation region, which, together with a part of the silicon carbide semiconductor body between neighboring compensation regions, form a super-junction structure. By electrically connecting the compensation regions and the shielding regions at the bottom of the trench structure, avalanche current may be discharged via the bottom of the trench structure. This allows for counteracting triggering of a parasitic bipolar transistor including the body region as base. Thereby, an avalanche robustness of the semiconductor device may be improved.

According to an embodiment of the semiconductor device, the silicon carbide semiconductor body may further comprise a drift region of the first conductivity type. Along a lateral direction perpendicular to the vertical direction, a first part of the drift region may be arranged between neighboring compensation regions in a first silicon carbide semiconductor layer of the drift region having a first background doping concentration. The background doping concentration of a semiconductor layer corresponds to the intentionally introduced doping during deposition of the semiconductor layer, e.g. the doping concentration introduced by in-situ doping during layer deposition.

According to an embodiment of the semiconductor device, the first part may include, along the lateral direction, first and second end sections and a central section arranged between the first and second end sections. A doping concentration of each of the first and second end sections may correspond to the first background doping concentration and a doping concentration in the central section may be larger than the first background doping concentration. The central section may be formed by a masked ion implantation process and/or by a masked process for introducing dopants into the central section. This may allow for a precise adjustment of a charge balance of the super-junction structure.

According to an embodiment, the semiconductor device may further comprise a second part of the drift region between the first part and the first surface. The second part may include a current spread region having a larger doping concentration than the first background doping concentration. This may allow for a further reduction of the area-specific on-state resistance $R_{DS(on)}$, for example.

According to an embodiment, the semiconductor device may further comprise a third part of the drift region between the first part and a second surface of the silicon carbide semiconductor body opposite to the first surface. The third part may be arranged in a second silicon carbide semiconductor layer of the drift region having a second background doping concentration smaller than the first background doping concentration. This may allow for a separate optimization of contributions to the area-specific on-state resistance $R_{DS(on)}$ that are caused by i) a part of the drift zone that, together with the compensations regions, forms the super-junction structure, and ii) another part of the drift zone arranged as a pedestal layer between the super-junction structure and a second surface opposite to the first surface.

According to an embodiment of the semiconductor device, a doping concentration of the compensation region averaged along a lateral dimension in the lateral direction times the lateral dimension and a doping concentration of the first part of the drift region averaged along a lateral dimension in the lateral direction times the lateral dimension may differ by less than 20%, or by less than 10%, or by even less than 5%. When a doping concentration of the compensation region averaged along a lateral dimension in the lateral direction times the lateral dimension equals a doping concentration of the first part of the drift region averaged along a lateral dimension in the lateral direction times the lateral dimension, ideal compensation between positive and negative charges in a space charge region extending over the super-junction structure may be achieved. In case of excess p-charges in the space charge region extending over the super-junction structure, a charge balance is shifted toward a so-called p-load, and in case of excess n-charges in a space charge region extending over the super-junction structure, a charge balance is shifted toward a so-called n-load. This may allow for electric field shaping along the vertical direction, and thus to tune an electric breakdown characteristic of the semiconductor device, for example.

According to an embodiment of the semiconductor device, the auxiliary electrode of each trench structure may comprise a connection portion extending from the first surface to the bottom of the trench structure. The connection portion may be arranged at an edge of a transistor cell array, for example. The gate electrode may be absent in the connection portion of the trench structure. Thus, a material of the auxiliary electrode may extend from the bottom of the trench structure to the top of the trench structure, for example. The connection portion may also be arranged in an interconnection trench linking neighboring trench structures. In the interconnection trench, the gate electrode may be at least partially absent for electrically connecting the auxiliary electrode at the first surface.

According to an embodiment, the semiconductor device may further comprise a contact layer at the second surface. The contact layer may have a first vertical distance to the bottom of each of the trench structures. A second vertical dimension of each shielding region may range between at least 0.1% and at most 20% of the first vertical distance. In some embodiments, the second vertical dimension of each shielding region may be at least 0.1% and at most 10%, or at most 5%, of the first vertical distance. According to another embodiment, a third vertical dimension of each compensation region may range between at least 0.1% and at most 20% of the first vertical distance. In some embodiments, the third vertical dimension of each compensation region may be at least 0.1% and at most 10%, or at most 5%, of the first vertical distance.

According to an embodiment of the semiconductor device, a first lateral dimension of the auxiliary electrode at the bottom of the trench structure may be smaller than a second lateral dimension of the shielding region at the bottom of the trench structure. This may allow for ensuring a voltage blocking capability between the auxiliary electrode and the drift zone, for example.

According to an embodiment of the semiconductor device, the auxiliary electrode may be protruded by the adjoining shielding region along the lateral direction by a lateral distance. A doping concentration of the shielding region averaged along the lateral distance in the lateral direction times the lateral distance is greater than the breakdown electric field strength in silicon carbide divided by the elementary charge. This may allow for avoiding an undesired electrical breakdown between the drift zone and the auxiliary electrode, for example.

According to an embodiment of the semiconductor device, the second lateral dimension of the shielding region at the bottom of the trench structure may be smaller than a third lateral dimension of the compensation region at the bottom of the shielding region. This may allow for independently optimizing a voltage blocking capability between the drift zone and the shielding regions on the one hand and the reduction of the area-specific on-state resistance $R_{DS(on)}$ by the compensation regions of the super-junction structure on the other hand.

According to an embodiment of the semiconductor device, the second vertical dimension of the shielding region is smaller than a third vertical dimension of the compensation region. This may allow for independently optimizing a voltage blocking capability between the drift zone and the shielding regions on the one hand and the reduction of the area-specific on-state resistance $R_{DS(on)}$ by the compensation regions of the super-junction structure on the other hand.

According to an embodiment of the semiconductor device, each of the trench structures may be strip-shaped and extend along a first lateral direction, and each of the compensation regions may also be strip-shaped and extend along the first lateral direction. Hence, an extension direction of the gate structures may correspond to an extension direction of the compensation regions of the super-junction structure, i.e. the trench structures may extend parallel to the compensation regions. According to another embodiment of the semiconductor device, each of the trench structures may be strip-shaped and extend along a first lateral direction, and each of the compensation regions may be strip-shaped and extend along a second lateral direction different from the first lateral direction.

According to an embodiment of the semiconductor device, a first pitch between neighboring compensation regions may be an integer multiple of a pitch between neighboring trench structures, wherein the integer multiple equals 1 or 2 or is greater than 2. This may allow for an independent optimization of the super-junction structure, including the compensation regions, and a field effect transistor cell structure, including the trench structure.

According to an embodiment of the semiconductor device, the doping concentration of the compensation region averaged along the lateral dimension of the compensation region in the lateral direction times the lateral dimension is smaller than the electric breakdown field strength in SiC divided by the elementary charge.

According to an embodiment of the semiconductor device, each trench structure may comprise a dielectric structure, the dielectric structure may comprise a gate dielectric between the gate electrode and the silicon carbide semiconductor body. The dielectric structure may further comprise a dielectric between the auxiliary electrode and the silicon carbide semiconductor body and a separation dielectric between the gate electrode and the auxiliary electrode. A thickness of the field dielectric may be larger than a thickness of the gate dielectric. According to an embodiment, the auxiliary electrode may be electrically coupled or electrically connected to a source electrode. The source electrode may be electrically connected to the source region.

According to an embodiment of a method of manufacturing a silicon carbide semiconductor device, the method may comprise forming, in a silicon carbide semiconductor body, a source region of a first conductivity type, a body region of a second conductivity type, shielding regions of the second conductivity type and compensation regions of the second conductivity type. The method may further comprise forming trench structures extending from a first surface into the silicon carbide semiconductor body along a vertical direction. Each of the trench structures may comprise an auxiliary electrode at a bottom of the trench structure and a gate electrode between the auxiliary electrode and the first surface. The auxiliary electrode may be electrically insulated from the gate electrode, and the auxiliary electrode of each of the trench structures may be adjoined by at least one of the shielding regions at the bottom of the trench structure. Each of the shielding regions may be adjoined by at least one of the compensation regions at a bottom of the shielding region.

The method may be applied for manufacturing the semiconductor device as described with respect to any of the above embodiments or any of the embodiments described below in connection with the figures. In at least some embodiments of the method, the following features (if applicable) apply, alone or in combination:

(i) forming at least one of the source region, the body region, the shielding regions, and the compensation regions may include at least one masked or unmasked ion implantation process;

(ii) forming the compensation regions may include one, two, three, four or even more ion implantation processes; if two or more ion implantation processes are used, the implantation processes may be performed with different implantation energies;

(iii) forming the trench structure includes forming a trench from the first surface into the silicon carbide semiconductor body;

(iv) forming the trench structure further includes forming a field dielectric of a dielectric structure in the trench, forming the auxiliary electrode on the field dielectric, forming a separation dielectric of the dielectric structure on the auxiliary electrode, forming a gate dielectric of the dielectric structure in the trench, and forming the gate electrode in the trench;

(v) forming the shielding regions includes forming an opening in the dielectric structure at a bottom side of the trench, and introducing dopants of the shielding regions into the silicon carbide semiconductor body by one or more ion implantation processes through the opening at the bottom side of the trench;

(vi) the compensation regions may be formed by a multi-epitaxial (ME) growth method including two or more repetitions of a layer deposition process and a doping process of the deposited layer.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

The embodiments described above will be further illustrated with respect to exemplary figures described below. As a mere example, an n-type channel semiconductor device is shown in the figures. However, the person skilled in the art will appreciate that certain concepts described in connection with the figures are also applicable to a p-type channel semiconductor device.

Functional and structural details described with respect to the embodiments above shall likewise apply to the exemplary embodiments illustrated in the figures and described further below.

Referring to the schematic cross-sectional views of FIGS. 1A and 1B, as well as the schematic top view of FIG. 1C, a semiconductor device 100 includes a silicon carbide, SiC semiconductor body 104. The SiC semiconductor body 104 includes an n$^+$-doped source region 101, a p-doped body region 105, p-doped shielding regions 112 and p-doped compensation regions 114.

Trench structures 102 extend from a first surface 103 into the SiC semiconductor body 104 along a vertical direction y. Each of the trench structures 102 includes an auxiliary electrode 106 at a bottom 108 of the trench structure 102 and a gate electrode 110 between the auxiliary electrode 106 and the first surface 103. The auxiliary electrode 106 is electrically insulated from the gate electrode 110 by a separation dielectric 1323 of a dielectric structure 132. The dielectric structure 132 further includes a gate dielectric 1321 arranged between the gate electrode 110 and the body region 105, a field dielectric 1322 arranged between the auxiliary electrode 106 and the SiC semiconductor body 104.

The auxiliary electrode 106 of each of the trench structures 106 is adjoined by at least one of the shielding regions 112 at the bottom 108 of the trench structure 106. The auxiliary electrode 106 may extend through an opening in the field dielectric 1322 and contact the shielding region 112, for example. According to another embodiment, a highly p-doped contact layer may be arranged between the auxiliary electrode and the shielding region 112 for improving an ohmic contact.

Each of the shielding regions 112 is adjoined by at least one of the compensation regions 114 at the bottom of the shielding region 112. The second vertical dimension t2 of the shielding region 112 is smaller than a third vertical dimension t3 of the compensation region 114.

An interlayer dielectric 111 is arranged between a source electrode 113 and the first surface 103. A contact structure 115, e.g. a contact line, provides an electrical connection between the source region 101 and the source electrode 113 (see cross-sectional view of FIG. 1A along line AA' of FIG. 1C) and further provides an electrical connection between the body region 105 and the source electrode 113 (see cross-sectional view of FIG. 1B along line BB' of FIG. 1C). Referring to FIG. 1B, a p$^+$-doped body contact region 107 is arranged between the body region 105 and the contact structure 107 for the purpose of improving an ohmic contact.

The contact structure 115 may fill an opening in the interlayer dielectric 111.

The semiconductor device 100 further includes an n-doped drift region 116. Along a lateral direction x perpendicular to the vertical direction y, a first part 1161 of the drift region 116 is arranged between neighboring compensation regions 114 in a first silicon carbide semiconductor layer 118 of the drift region 116 having a first background doping concentration. The compensation regions 114 and the first parts 1161 form a super-junction structure 120.

The semiconductor device 100 further includes a contact layer 130 at a second surface 125 opposite to the first surface 103. The contact layer 130 is arranged at a first vertical distance t1 to the bottom 108 of each of the trench structures 102. A second vertical dimension t2 of each shielding region 114 may range between at least 0.1% and at most 10% of the first vertical distance t1. An n$^+$-doped contact region 127 is arranged between the drift region 118 and the contact layer 130 for the purpose of improving an ohmic contact.

Referring to the schematic cross-sectional view of FIG. 2, another embodiment of the semiconductor device 100 further includes, in addition to the features described with reference to FIGS. 1A to 1C, a second part 1162 of the drift region 116 between the first part 1161 and the first surface 103. The second part 1162 includes or corresponds to a current spread region 124 having a larger doping concentration than the first background doping concentration.

Figure 3:
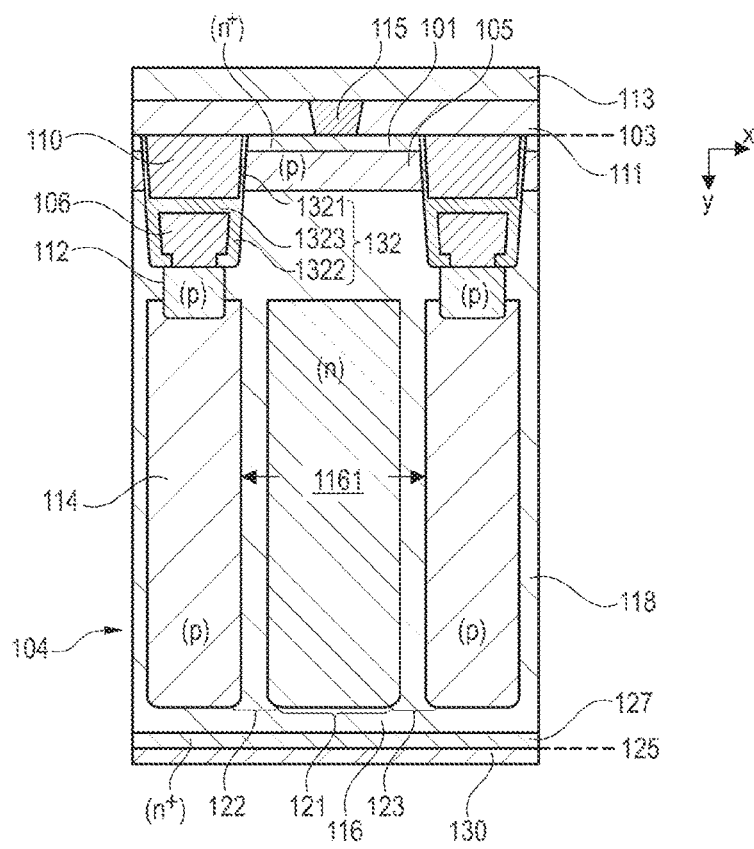
FIG. 3 illustrates a cross-sectional view through another embodiment of a super-junction silicon carbide semiconductor device including a section of an n-doped drift region as part of the super-junction.

Referring to the schematic cross-sectional view of FIG. 3, according to another embodiment of the semiconductor device 100, the first part 1161 includes first and second end sections 122, 123 and a central section 121 arranged between the first and second end sections 122, 123. A doping concentration of each of the first and second end sections 122, 123 corresponds to the first background doping concentration and a doping concentration in the central section 121 is larger than the first background doping concentration. The central section 121 may be formed by processes similar to the processes used for forming the compensation regions 114, for example.

Figure 2:
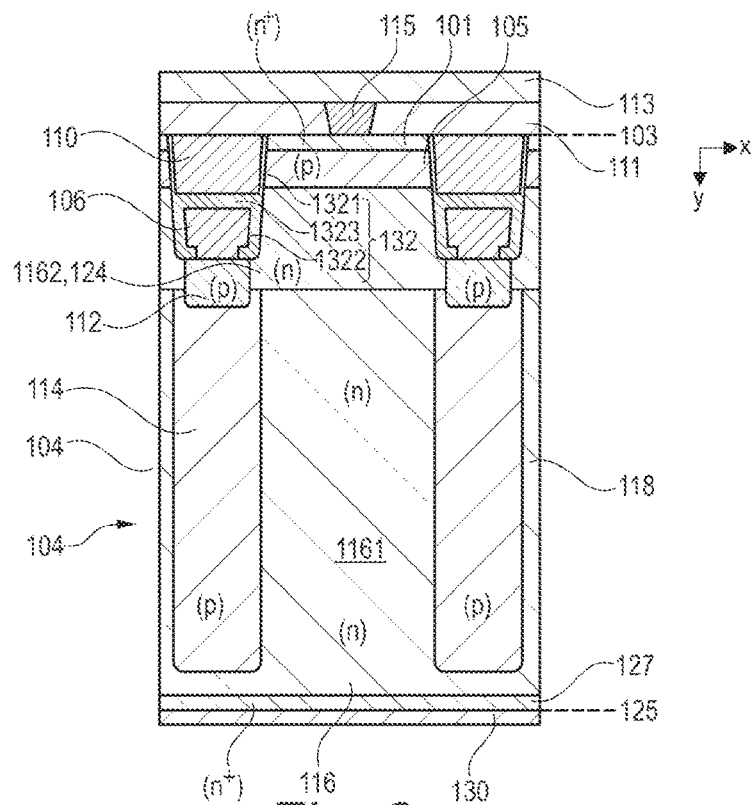
FIG. 2 illustrates a cross-sectional view through an embodiment of a super-junction silicon carbide semiconductor device including a current spread region.
Figure 4:
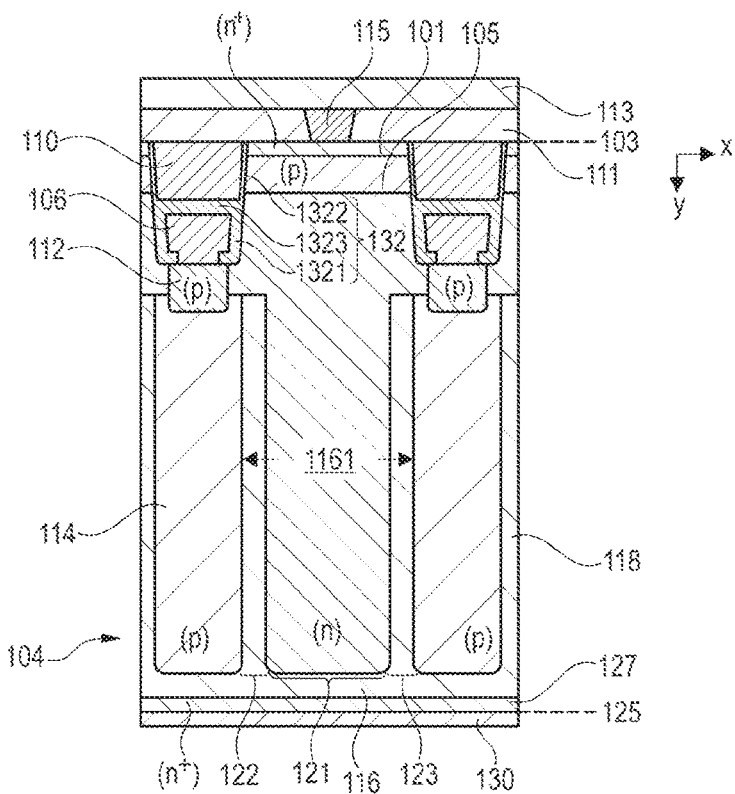
FIG. 4 illustrates a cross-sectional view through another embodiment of a super-junction silicon carbide semiconductor device including a combination of features illustrated in the embodiments of FIGS. 2 and 3.

Referring to the schematic cross-sectional view of FIG. 4, according to another embodiment of the semiconductor device 100, the current spread region 124 illustrated in FIG. 2 and the first and second end sections 122, 123 as well as the central section 121 are combined.

Figure 5:
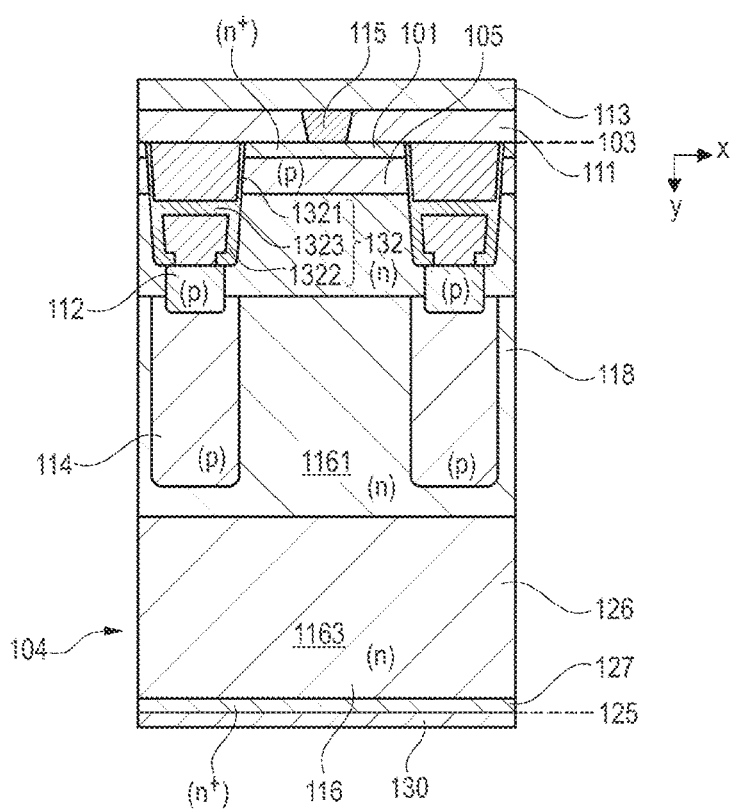
FIG. 5 illustrates a cross-sectional view through another embodiment of a super-junction silicon carbide semiconductor device including silicon carbide semiconductor layers having different doping concentrations.

Referring to the schematic cross-sectional view of FIG. 5, another embodiment of the semiconductor device 100 further includes, in addition to features described with reference to FIG. 2, a third part 1163 of the drift region 116 between the first part 1161 and the second surface 125. The third part 1163 is arranged in a second silicon carbide semiconductor layer 126 of the drift region 116 having a second background doping concentration smaller than the first background doping concentration.

Referring to the schematic cross-sectional view of FIG. 6, another embodiment of the semiconductor device 100 further includes, in addition to features described with reference to FIG. 5, the first and second end sections 122, 123 and the central section 121.

A doping concentration $c_{cav}$ of the compensation region 114 averaged along a lateral dimension $l_c$ in the lateral direction x times the lateral dimension ic and a doping concentration $c_{dav}$ of the first part 1161 of the drift region 116 averaged along a lateral dimension $l_d$ in the lateral direction x times the lateral dimension $l_d$ may differ by less than 20%. Thus, a relation $0.8 \times l_c \times c_{cav} < l_d \times c_{dav} < 1.2 \times l_c \times c_{cav}$ may hold.

As is illustrated in the magnifying cutout of FIG. 6, a first lateral dimension w1 of the auxiliary electrode 106 at the bottom 108 of the trench structure 102 is smaller than a second lateral dimension w2 of the shielding region 112 at the bottom 108 of the trench structure 102.

The auxiliary electrode 106 may be protruded by the adjoining shielding region 112 along the lateral direction x by a lateral distance 11. A doping concentration $c_{sav}$ of the shielding region 106 averaged along the lateral distance 11 in the lateral direction x times the lateral distance 11 may be greater than the electric breakdown electric field strength EB in silicon carbide divided by the elementary charge e. Thus a relation $11 \times c_{sav} > E_B/e$ may hold.

The second lateral dimension w2 of the shielding region 112 at the bottom 108 of the trench structure 102 may be smaller than a third lateral dimension w3 of the compensation region 114 at the bottom of the shielding region 112.

Figure 7:
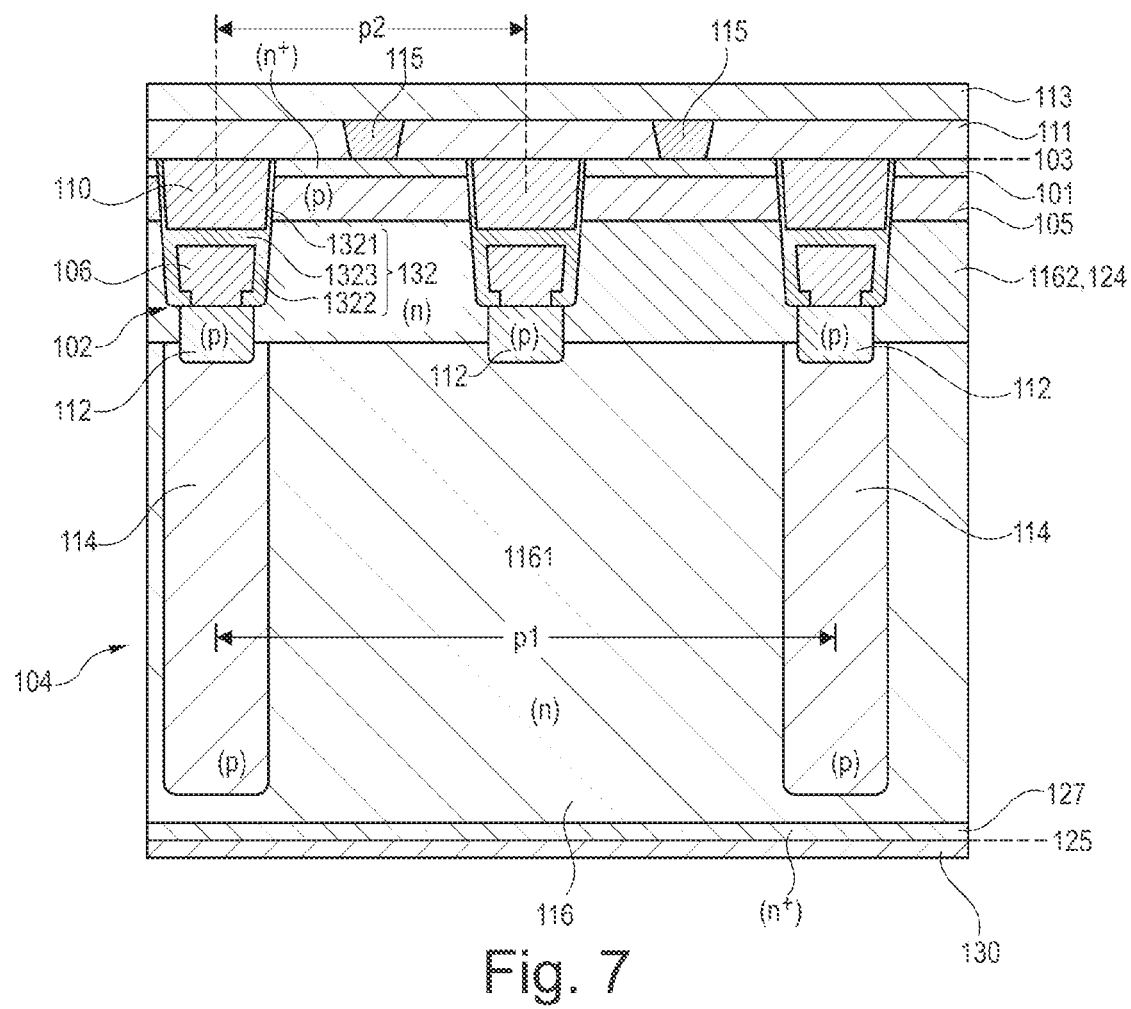
FIG. 7 illustrates a cross-sectional view through another embodiment of a super-junction silicon carbide semiconductor device including a first pitch between neighboring compensation regions that is larger than a second pitch between neighboring trench structures.

Referring to the schematic cross-sectional view of another embodiment of the semiconductor device 100 illustrated in FIG. 1, a first pitch p1 between neighboring compensation regions 114 may be an integer multiple n of a second pitch p2 between neighboring trench structures 102, $p1=n \times p2$, n being equal to 1 or equal to or greater than 2. In the embodiment illustrated in FIG. 7, the second pitch p2 is equal to half of the first pitch p1.

Figure 8A:
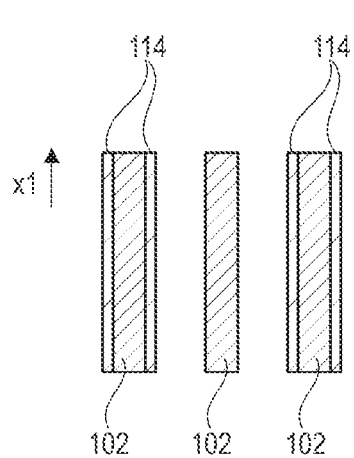
FIG. 8A is a top view for illustrating an embodiment of a silicon carbide semiconductor device having a parallel extension of trench structures and compensation regions.

Referring to the schematic top view of an embodiment of the semiconductor device illustrated in FIG. 8A, each of the trench structures 102 is strip-shaped and extends along a first lateral direction x1, and each of the compensation regions 114 is strip-shaped and extends along the first lateral direction x1.

Figure 8B:
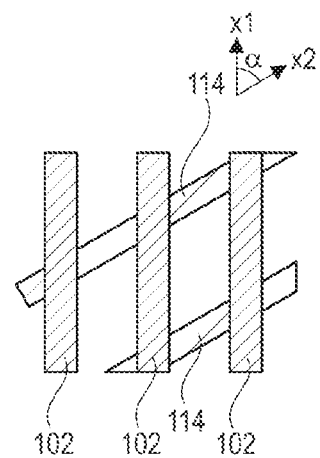
FIGS. 8B and 8C are top views for illustrating embodiments of silicon carbide semiconductor devices having different directions of extension of trench structures and compensation regions.
Figure 8C:
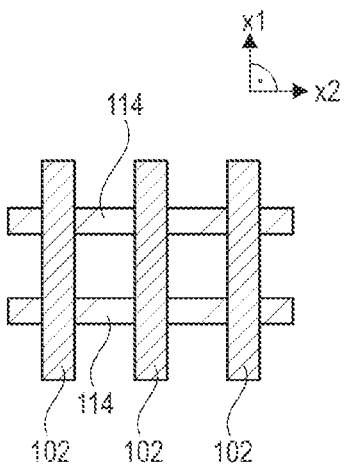

Referring to the schematic top view of an embodiment of the semiconductor device illustrated in FIG. 8B, each of the trench structures 102 is strip-shaped and extends along the first lateral direction x1, and each of the compensation regions 114 is strip-shaped and extends along a second lateral direction x2 different from the first lateral direction x2. As is illustrated in the schematic top view of FIG. 8B, an angle α between the first and second directions x1, x2 may range between 0 degree and 90 degree. In the embodiment illustrated in the schematic top view of FIG. 8C, the angle 1 is equal to 90 degree, i.e. the first direction x1 and the second direction x2 are perpendicular to one another.

In other embodiments (not shown in the Figures), the trench structures 102 may be of a circular, a hexagonal or a square shape. The lateral width may then approximately correspond to the length of the trench gate structure 102. A channel region and/or the body region may adjoin more than one sidewall or even more than two sidewalls of the trench structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a silicon carbide semiconductor body comprising a source region of a first conductivity type, a body region of a second conductivity type, shielding regions of the second conductivity type and compensation regions of the second conductivity type; and
   trench structures extending from a first surface into the silicon carbide semiconductor body along a vertical direction (y), wherein each of the trench structures comprises an auxiliary electrode at a bottom of the trench structure and a gate electrode between the auxiliary electrode and the first surface, wherein the auxiliary electrode is electrically insulated from the gate electrode,
   wherein the auxiliary electrode of each of the trench structures is adjoined by at least one of the shielding regions at the bottom of the trench structure, and
   wherein each of the shielding regions is adjoined by at least one of the compensation regions at the bottom of the shielding region,
   wherein the auxiliary electrode of each trench structure comprises a connection portion extending from the first surface to the bottom of the trench structure.

2. The semiconductor device of claim 1, wherein the silicon carbide semiconductor body further comprises a drift region of the first conductivity type, wherein, along a lateral direction perpendicular to the vertical direction, a first part of the drift region is arranged between neighboring compensation regions in a first silicon carbide semiconductor layer of the drift region having a first background doping concentration.

3. The semiconductor device of claim 2, wherein the first part includes, along the lateral direction, first and second end sections and a central section arranged between the first and second end sections, and wherein a doping concentration of each of the first and second end sections corresponds to the first background doping concentration and a doping concentration in the central section is larger than the first background doping concentration.

4. The semiconductor device of claim 2, further comprising a second part of the drift region between the first part and the first surface, wherein the second part includes a current spread region having a larger doping concentration than the first background doping concentration.

5. The semiconductor device of claim 2, further comprising a third part of the drift region between the first part and a second surface of the silicon carbide semiconductor body opposite to the first surface, wherein the third part is arranged in a second silicon carbide semiconductor layer of the drift region having a second background doping concentration smaller than the first background doping concentration.

6. The semiconductor device of claim 2, wherein a doping concentration of the compensation region averaged along a lateral dimension in the lateral direction times the lateral dimension and a doping concentration of the first part of the drift region averaged along a lateral dimension in the lateral direction times the lateral dimension differ by less than 20%.

7. The semiconductor device of claim 1, further comprising a contact layer at a second surface of the silicon carbide semiconductor body opposite to the first surface, the contact layer having a first vertical distance to the bottom of each of the trench structures, wherein a second vertical dimension of each shielding region ranges between at least 0.1% and at most 20% of the first vertical distance.

8. The semiconductor device of claim 1, wherein a first lateral dimension of the auxiliary electrode at the bottom of the trench structure is smaller than a second lateral dimension of the shielding regions at the bottom of the trench structure.

9. The semiconductor device of claim 1, wherein a second lateral dimension of the shielding region at the bottom of the trench structure is smaller than a third lateral dimension of the compensation region at the bottom of the shielding region.

10. The semiconductor device of claim 1, wherein a second vertical dimension of the shielding regions is smaller than a third vertical dimension of the compensation regions.

11. The semiconductor device of claim 1, wherein each of the trench structures is strip-shaped and extends along a first lateral direction, and each of the compensation regions is strip-shaped and extends along the first lateral direction.

12. The semiconductor device of claim 1, wherein each of the trench structures is strip-shaped and extends along a first lateral direction, and each of the compensation regions is strip-shaped and extends along a second lateral direction different from the first lateral direction.

13. The semiconductor device of claim 1, wherein a first pitch between neighboring compensation regions is an integer multiple of a second pitch between neighboring trench structures, the integer multiple being equal to 1 or equal to 2 or greater than 2.

14. The semiconductor device of claim 1, wherein each trench structure comprises a dielectric structure, the dielectric structure comprising a gate dielectric between the gate electrode and the silicon carbide semiconductor body, a field dielectric between the auxiliary electrode and the silicon carbide semiconductor body and a separation dielectric between the gate electrode and the auxiliary electrode, wherein a thickness of the field dielectric is larger than a thickness of the gate dielectric.

15. A method of manufacturing a silicon carbide semiconductor device, the method comprising:
  forming, in a silicon carbide semiconductor body, a source region of a first conductivity type, a body region of a second conductivity type, shielding regions of the second conductivity type and compensation regions of the second conductivity type;
  forming trench structures extending from a first surface into the silicon carbide semiconductor body along a vertical direction, wherein each of the trench structures comprises an auxiliary electrode at a bottom of the trench structure and a gate electrode between the auxiliary electrode and the first surface, wherein the auxiliary electrode is electrically insulated from the gate electrode, wherein the auxiliary electrode of each of the trench structures is adjoined by at least one of the shielding regions at the bottom of the trench structure, and
  wherein each of the shielding regions is adjoined by at least one of the compensation regions at a bottom of the shielding region,
  wherein the auxiliary electrode of each trench structure comprises a connection portion extending from the first surface to the bottom of the trench structure.

16. A semiconductor device comprising:
  a silicon carbide semiconductor body comprising a source region of a first conductivity type, a body region of a second conductivity type, shielding regions of the second conductivity type and compensation regions of the second conductivity type; and
  trench structures extending from a first surface into the silicon carbide semiconductor body along a vertical direction (y), wherein each of the trench structures comprises an auxiliary electrode at a bottom of the trench structure and a gate electrode between the auxiliary electrode and the first surface, wherein the auxiliary electrode is electrically insulated from the gate electrode,
  wherein the auxiliary electrode of each of the trench structures is adjoined by at least one of the shielding regions at the bottom of the trench structure, and
  wherein each of the shielding regions is adjoined by at least one of the compensation regions at the bottom of the shielding region,
  wherein the silicon carbide semiconductor body further comprises a drift region of the first conductivity type, wherein, along a lateral direction perpendicular to the vertical direction, a first part of the drift region is arranged between neighboring compensation regions in a first silicon carbide semiconductor layer of the drift region having a first background doping concentration, and
  wherein a doping concentration of the compensation region averaged along a lateral dimension in the lateral direction times the lateral dimension and a doping concentration of the first part of the drift region averaged along a lateral dimension in the lateral direction times the lateral dimension differ by less than 20%.

17. A semiconductor device comprising:
  a silicon carbide semiconductor body comprising a source region of a first conductivity type, a body region of a second conductivity type, shielding regions of the second conductivity type and compensation regions of the second conductivity type; and
  trench structures extending from a first surface into the silicon carbide semiconductor body along a vertical direction (y), wherein each of the trench structures comprises an auxiliary electrode at a bottom of the trench structure and a gate electrode between the auxiliary electrode and the first surface, wherein the auxiliary electrode is electrically insulated from the gate electrode,
  wherein the auxiliary electrode of each of the trench structures is adjoined by at least one of the shielding regions at the bottom of the trench structure, and
  wherein each of the shielding regions is adjoined by at least one of the compensation regions at the bottom of the shielding region,
  wherein a second lateral dimension of the shielding region at the bottom of the trench structure is smaller than a third lateral dimension of the compensation region at the bottom of the shielding region.

* * * * *